(12) United States Patent
Kang et al.

(10) Patent No.: US 7,432,743 B2
(45) Date of Patent: Oct. 7, 2008

(54) DATA INPUT BUTTER FOR USE IN A SEMICONDUCTOR DEVICE

(75) Inventors: Hee-Bok Kang, Kyoungki-do (KR); Jin-Hong Ahn, Kyoungki-do (KR)

(73) Assignee: Hynix Semiconductor Inc. (KR)

( * ) Notice: Subject to any disclaimer, the term of this patent is extended or adjusted under 35 U.S.C. 154(b) by 41 days.

(21) Appl. No.: 11/154,216

(22) Filed: Jun. 15, 2005

(65) Prior Publication Data

US 2006/0197559 A1 Sep. 7, 2006

(30) Foreign Application Priority Data

Mar. 2, 2005 (KR) ............... 10-2005-0017397

(51) Int. Cl.
*H03F 3/45* (2006.01)
(52) U.S. Cl. .......................... 327/51; 327/52
(58) Field of Classification Search ............ 327/50–53, 327/108, 312
See application file for complete search history.

(56) References Cited

U.S. PATENT DOCUMENTS

| 6,318,707 | B1 * | 11/2001 | Hara et al. ................. 365/233 |
| 6,768,691 | B2 | 7/2004 | Kumazaki et al. |
| 6,768,697 | B2 | 7/2004 | Labrum et al. |
| 6,897,684 | B2 * | 5/2005 | Oi et al. ........................ 326/86 |
| 2003/0016512 | A1 | 1/2003 | McCall et al. |
| 2003/0223303 | A1 | 12/2003 | Lamb et al. |
| 2004/0066683 | A1 | 4/2004 | Hartmann et al. |

FOREIGN PATENT DOCUMENTS

| JP | 03-053712 | 3/1991 |
| KR | 98-028353 | 7/1998 |
| KR | 98-069505 | 10/1998 |
| KR | 10-2004-0023837 | 3/2004 |

* cited by examiner

*Primary Examiner*—Dinh T. Le
(74) *Attorney, Agent, or Firm*—Blakely, Sokoloff, Taylor & Zafman (57) ABSTRACT

The present invention provides a semiconductor design technology, in particular a data input buffer for use therein. This data input buffer secures a data level sensing margin in a weak data transmission cycle upon an asymmetrical data pattern transmission. Specifically, the present invention provides a technology of improving a level sensing margin in a weak data transmission cycle following after adjusting a reference level for input sensing by a constant level toward a strong data direction in a strong data transmission cycle (in case of repeating data with same polarity) by tracing a pattern of transmission data. Further, the present invention employs a method of adjusting an amount of current that flows in a data input part and a reference voltage input part to make a pull-up/pull-down of the reference level without a change of the reference voltage that is constant voltage.

13 Claims, 9 Drawing Sheets

DATA INPUT BUTTER FOR USE IN A SEMICONDUCTOR DEVICE

FIELD OF THE INVENTION

The present invention relates to a semiconductor design technology; and, more particularly, to a data input buffer for use in a semiconductor device.

DESCRIPTION OF RELATED ART

As is well known, a semiconductor device is manufactured based on various semiconductor technologies including a silicon wafer process technology and a logic design technology. A final product of semiconductor manufacturing process is a chip of plastic package form, which is provided with logic and function that are distinguishable from other things according to the use purpose. Most of semiconductor chips are mounted on PCB that is one of important elements in the system configuration, and receive a proper driving voltage for driving its own chip.

All semiconductor devices as well as a semiconductor memory are operated depending on an input/output of signals with specific purposes. In other words, based on a combination of those signals, it is decided whether each semiconductor device will be operated or not. Also, its operation mode is decided by such a signal combination. Further, according to output signals provided, the results are issued. Among the output signals, an output signal from any semiconductor device may be used as input signal in other semiconductor devices within a same system.

Meanwhile, there is employed an input buffer which buffers a signal from the outside and provides it to any of other elements within a semiconductor device. It is known that the simplest input buffer is a static input buffer. The static input buffer is of a shape of an inverter that connects a PMOS transistor to an NMOS transistor in series, which are prepared between a power supply voltage port and the ground port. This static input buffer has an advantage that its configuration is very simple, but has a disadvantage that it requires an input signal of a larger width due to a weak immunity to noises. That is, this buffer requires a larger swing width of logic high level and logic low level. Thus, it may be not proper to apply such buffer to a device that requires an input signal of a lower swing width or higher operation frequency.

To meet this requirement, there has been proposed an input buffer of a differential amplification type. As a concept contrary to the static input buffer, it is frequently called dynamic input buffer.

Figure 1:
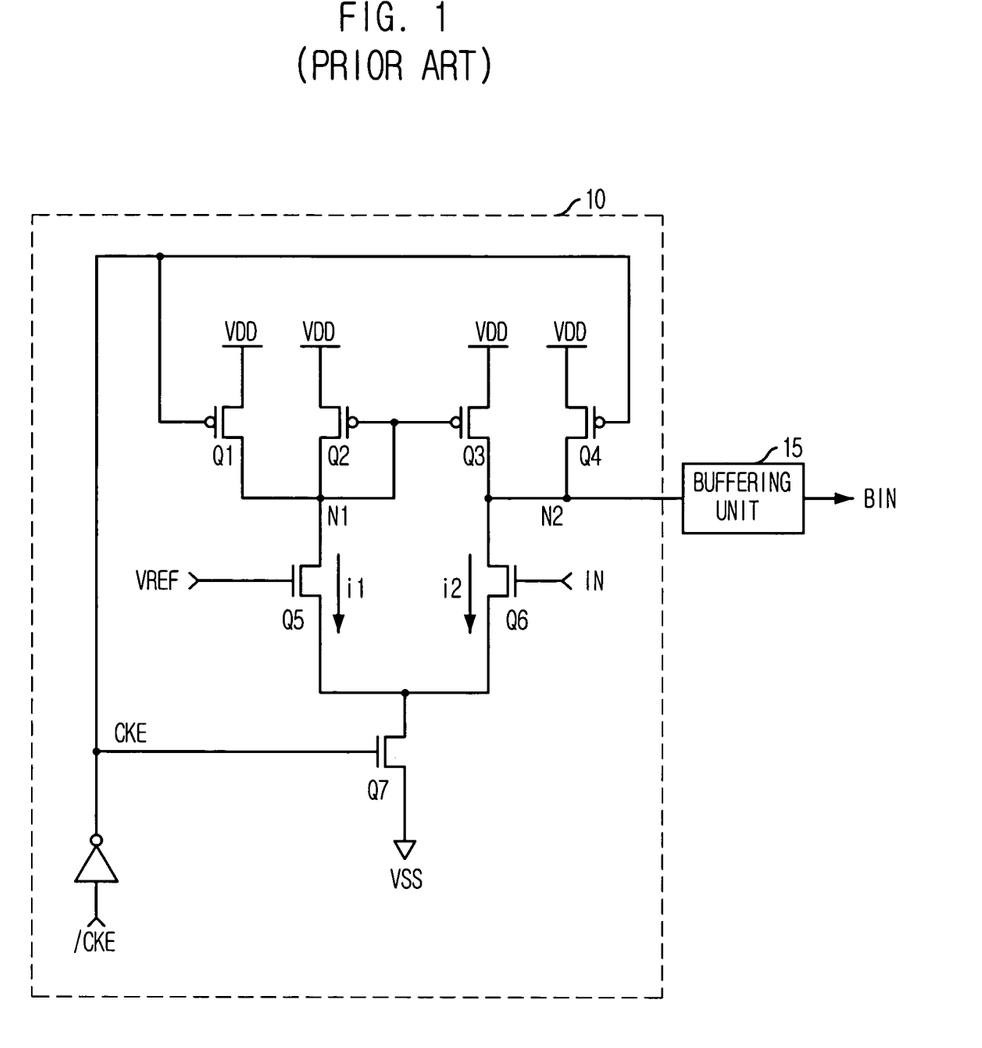
FIG. 1 is a circuit diagram showing a conventional data input buffer.

FIG. 1 shows a circuit diagram of a data input buffer with differential amplification type according to the prior art.

Referring to FIG. 1, the prior art data input buffer with differential amplification type is largely comprised of an input sensing unit 10 for sensing a logic level of input data IN by a comparison of a reference voltage VREF and a voltage level of the input data IN, and a buffering unit 15 for buffering an output signal from the input sensing unit 10.

Herein, the input sensing unit 10 includes an input NMOS transistor Q5 whose gate inputs the reference voltage VREF, an input NMOS transistor Q6 whose gate inputs the input data IN, load PMOS transistors Q2, Q3 which are connected between the power supply voltage port VDD and the input NMOS transistors Q5, Q6 and form a current mirror, a bias NMOS transistor Q7, which is commonly coupled between the ground port VSS and the two input NMOS transistors Q5, Q6, and whose gate inputs a clock enable signal CKE which is obtained by inverting a signal /CKE through an inverter, and two PMOS transistors Q1, Q4 which are coupled between the power supply voltage port VDD and each of the two input NMOS transistors Q5, Q6, in parallel with the load PMOS transistors Q2, Q3, and whose gate inputs the clock enable signal CKE.

On the other hand, the buffering unit 15 is generally composed of an odd number of CMOS transistor(s) that input(s) an output signal from the input sensing unit 10 and output(s) an internal data signal BIN, wherein if the odd number is larger than 3, they are connected in series.

For instance, if the input data IN with high electric potential is inputted, an internal node of the input sensing unit 10, since it is higher than the reference voltage VREF, is operated to reflect such state. Herein, the reference voltage VREF is a constant voltage (Conventionally, VDD/2) whose electric potential is always constant, wherein it is provided through a specific input pin from the outside of the semiconductor device, or is generated in the semiconductor device itself.

The input NMOS transistor Q5 inputting the reference voltage VREF always allows a flow of a same current i1. Further, the input NMOS transistor Q6, which is arranged symmetrically with the input NMOS transistor Q5, allows a current i2 that is decided by an electric potential level of the input data IN. As a result, the input sensing unit 10 decides an electric potential level on an output node N2 depending on a quantitative comparison of the currents i1 and i2.

First of all, if the clock enable signal /CKE is of logic low level and is in activation state, then the bias NMOS transistor Q7 is turned-on and the PMOS transistors Q1, Q4 are turned-off, thus making the input buffer normally operated.

In the meantime, if the clock enable signal CKE is logic high level and is inactivated, then the bias NMOS transistor Q7 is in off state, the input sensing unit 10 is disabled, and the PMOS transistors Q1, Q4 are turned-on. This allows the nodes N1 and N2 to make a pre-charge with logic high level, thereby preventing a generation of passing current by the data input buffer and reducing a current consumption in a stand-by state although the input data IN is varied.

Recently, as an operation voltage of the semiconductor device becomes low and its operation rate becomes fast, the performance of the data input buffer concerning the signal integrity has been focused as important factor. This is because the relationship between the swing width of the input data and the reference voltage decides characteristics of the data input buffer. In other words, if the swing width of the input data is small, then the noise margin decrease, while, if the swing width of the input data is large, then the noise margin improves wherein it results in any problem such as a cross talk.

Figure 2:
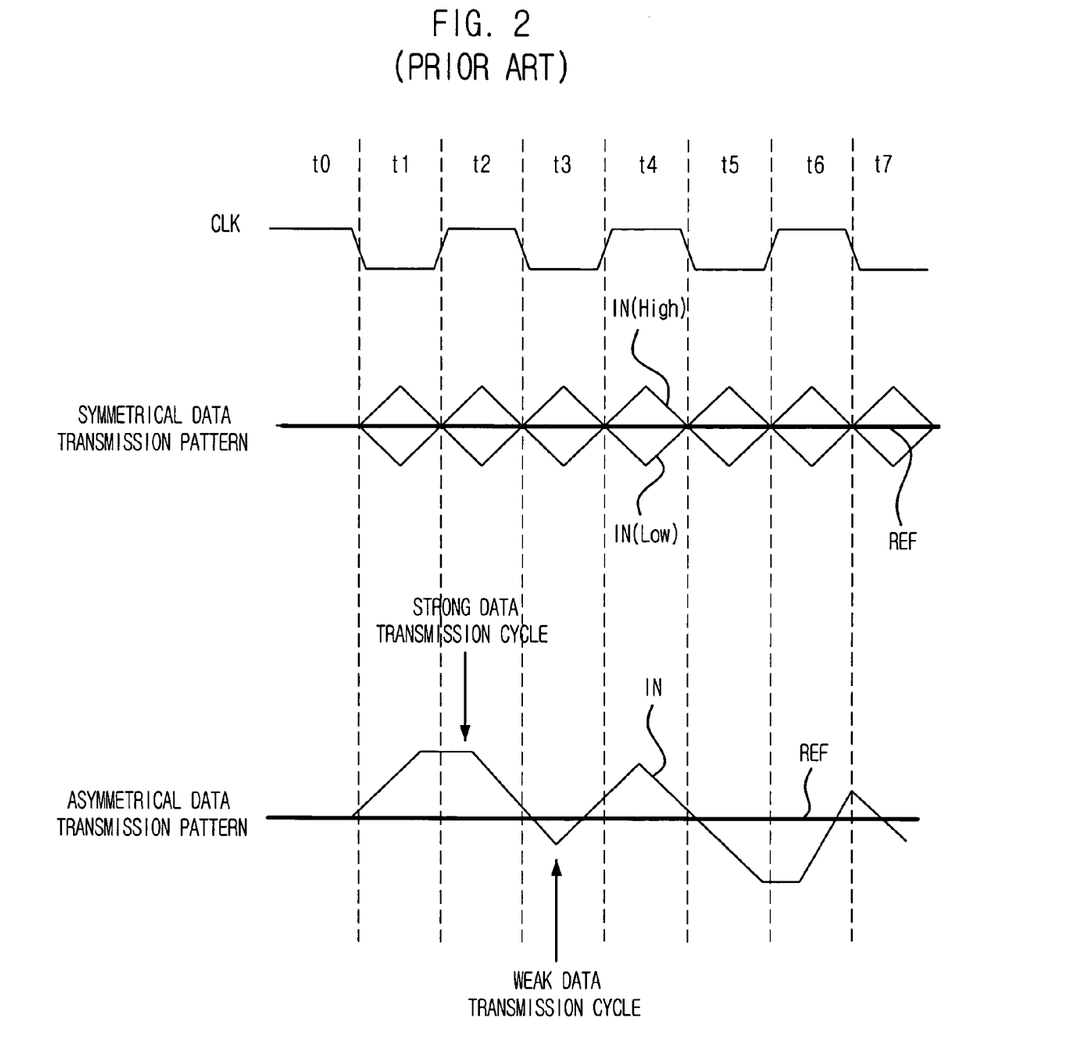
FIG. 2 is a diagram illustrating a waveform of a symmetrical data transmission pattern and an asymmetrical data transmission pattern.

In case of the prior art input buffer of differential amplification type as mentioned above, as shown in FIG. 2, there exists no problem when doing symmetrical data pattern transmission, indicating that low data and high data swing in a same width, but there exists a problem in data recognition when doing asymmetrical data pattern transmission. That is to say, if the operation rate (or clock frequency) of the semiconductor device is very fast, there occurs a situation that next data is transmitted before the voltage level of the input data reaches a fixed point, thus allowing the asymmetrical data transmission. Upon this asymmetrical data pattern transmission, there is well made the transmission of a same data pattern that repeats low data or high data continuously. However, there arises a problem upon data transmission of opposite polarity just following the continuous same data pattern.

For instance, if high data is continuously transmitted upon the asymmetrical data pattern transmission, the input data level gradually rises. And if low data is transmitted after the input data level rises as above, the input data does not appear that there is a large difference between its own data and the reference voltage since a drop of the input data level by the low data is not sufficient (called "weak data"). This noise is called inter-symbol interference noise. If this distorted signal is applied to the data input buffer, a level sensing margin of the data input buffer in weak data transmission cycle is low, thus resulting in a lowering of an immunity to noises in the data input buffer.

SUMMARY OF THE INVENTION

It is, therefore, a primary object of the present invention to provide a data input buffer for use in a semiconductor device that is capable of securing data level sensing margin in weak data transmission cycle upon asymmetrical data pattern transmission.

In accordance with one aspect of the present invention, there is provided a data input buffer for use in a semiconductor device comprising: an input sensing means for sensing a logic level of input data based on a comparison of a reference voltage and a voltage level of the input data; a reference level adjusting means for adjusting a reference level for the input sensing in the input sensing means in accordance with a pattern of the input data; and means for buffering an output signal from the input sensing means.

In accordance with another aspect of the present invention, there is provided a data input buffer for use in a semiconductor device comprising: an input sensing means for sensing a logic level of input data based on a comparison of a reference voltage and a voltage level of the input data; a reference level pull-up adjusting means for adjusting an amount of current that flows in a reference voltage input part of the input sensing means by tracing a transmission pattern of the input data; a reference level pull-down adjusting means for adjusting an amount of current that flows in a data input part of the input sensing means by tracing a transmission pattern of the input data; and means for buffering an output signal from the input sensing means.

BRIEF DESCRIPTION OF THE DRAWINGS

The above and other objects and features of the instant invention will become apparent from the following description of preferred embodiments taken in conjunction with the accompanying drawings, in which.

DETAILED DESCRIPTION OF THE INVENTION

The present invention provides a technology that improves a level sensing margin in a weak data transmission cycle following after adjusting a reference level for input sensing by a constant level toward a strong data direction in a strong data transmission cycle (in case of repeating data of same polarity) by tracing a pattern of transmission data. Further, the present invention employs a method of adjusting an amount of current that flows in a data input unit and a reference voltage input unit to do a pull-up/pull-down of the reference level for the input sensing without a change of the reference voltage that is constant voltage.

Hereinafter, to explain the present invention in order that a person skilled in the art could easily conceive the technical spirit to which the invention belongs, most preferred embodiments of the present invention will be described in detail with reference to the accompanying drawings.

Figure 3:
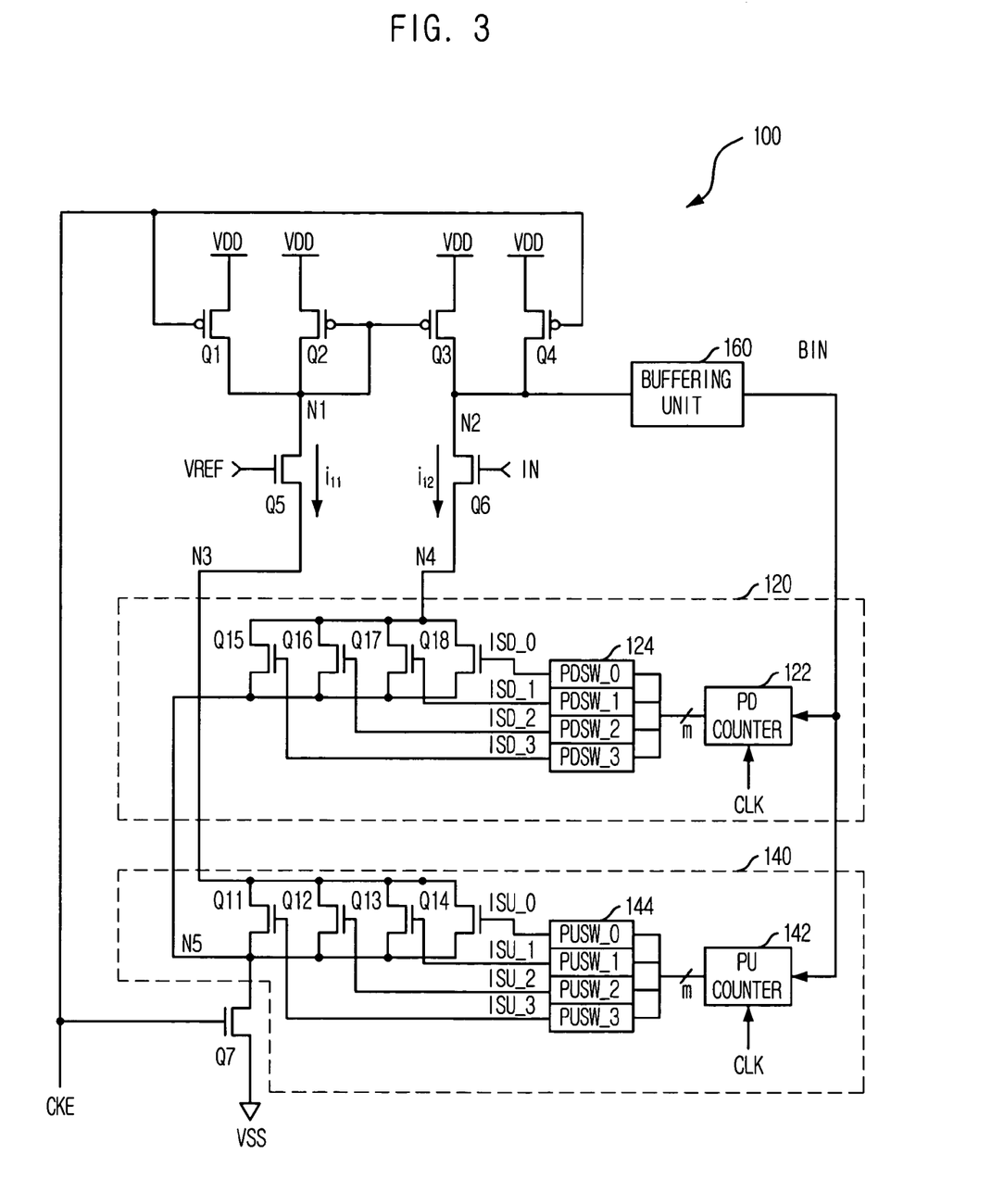
FIG. 3 is a circuit diagram showing a data input buffer in accordance with a preferred embodiment of the present invention.

FIG. 3 shows a circuit diagram of a data input buffer in accordance with a preferred embodiment of the present invention.

Referring to FIG. 3, the data input buffer 100 in accordance with the preferred embodiment of the present invention generally comprises an input sensing unit Q1 to Q7 for sensing a logic level of input data IN by a comparison of a reference voltage VREF and the input data IN, reference level adjusting units 120 and 140 for adjusting a reference level for input sensing by the input sensing unit according to a transmission pattern of the input data IN, and a buffering unit 160 for buffering an output signal from the input sensing unit.

Specifically, the reference level adjusting unit 120 and 140 includes a reference level pull-up adjustor 140 for making a pull-up of the reference level of the input sensing unit by a certain level compared to the reference voltage VREF by tracing a transmission pattern of the input data IN. It further includes a reference level pull-down adjustor 120 for making a pull-down of the reference level of the input sensing unit by a certain level compared to the reference voltage VREF by tracing a transmission pattern of the input data IN.

Herein, the reference level pull-up adjustor 140 is a circuit for gradationally adjusting an amount of current i11 that flows in a reference voltage input NMOS transistor Q5 contained in the input sensing unit. It includes a pull-up (PU) counter 142 for counting the number of continuous high data provided from the buffering unit 160, a first decoder 144 for decoding an m-bit count value (m is a natural number, but is set at 2 for illustration herein) from the PU counter 142, and a plurality of drive NMOS transistors Q11 to Q14 for driving the current i11 that flows in the reference voltage input NMOS transistor Q5 in the input sensing unit in response to output signals ISU_0 to ISU_3 from the first decoder 144.

Further, the reference level pull-down adjustor 120 is a circuit for gradationally adjusting an amount of current i12 that flows in a data input NMOS transistor Q6 contained in the input sensing unit. It includes a pull-down (PD) counter 122 for counting the number of continuous low data provided from the buffering unit 160, a second decoder 124 for decoding m-bit counter value (m is a natural number, but is set at 2 for illustration herein) from the PD counter 122, and a plurality of drive NMOS transistors Q15 to Q18 for driving the current i12 that flows in the data input NMOS transistor Q6 in the input sensing unit in response to output signals ISD_0 to ISD_3 from the second decoder 124. Herein, it is preferable that all the drive NMOS transistors Q11 to Q18 of the reference level pull-up adjustor 140 and the reference level pull-down adjustor 120 are designed to have same size.

Meanwhile, the first decoder 144 is 2×4 decoder, wherein PUSW_0 to PUSW_3 indicate four switches (implemented by NAND gates) for receiving a different combination of 2-bit count value from the PU counter 142. Further, the second decoder 124 is 2×4 decoder where PDSW_0 to PDSW_3 indicate four switches (implemented by NAND gates) for receiving a different combination of 2-bit count value from the PD counter 122.

FIGS. 4 to 9 are diagrams illustrating operation waveforms generated according to the asymmetrical data transmission pattern types of the data input buffer 100 shown in FIG. 3, respectively. Referring to these, an operation of the data input buffer 100 in accordance with the present invention will be described in detail hereinafter.

Figure 4:
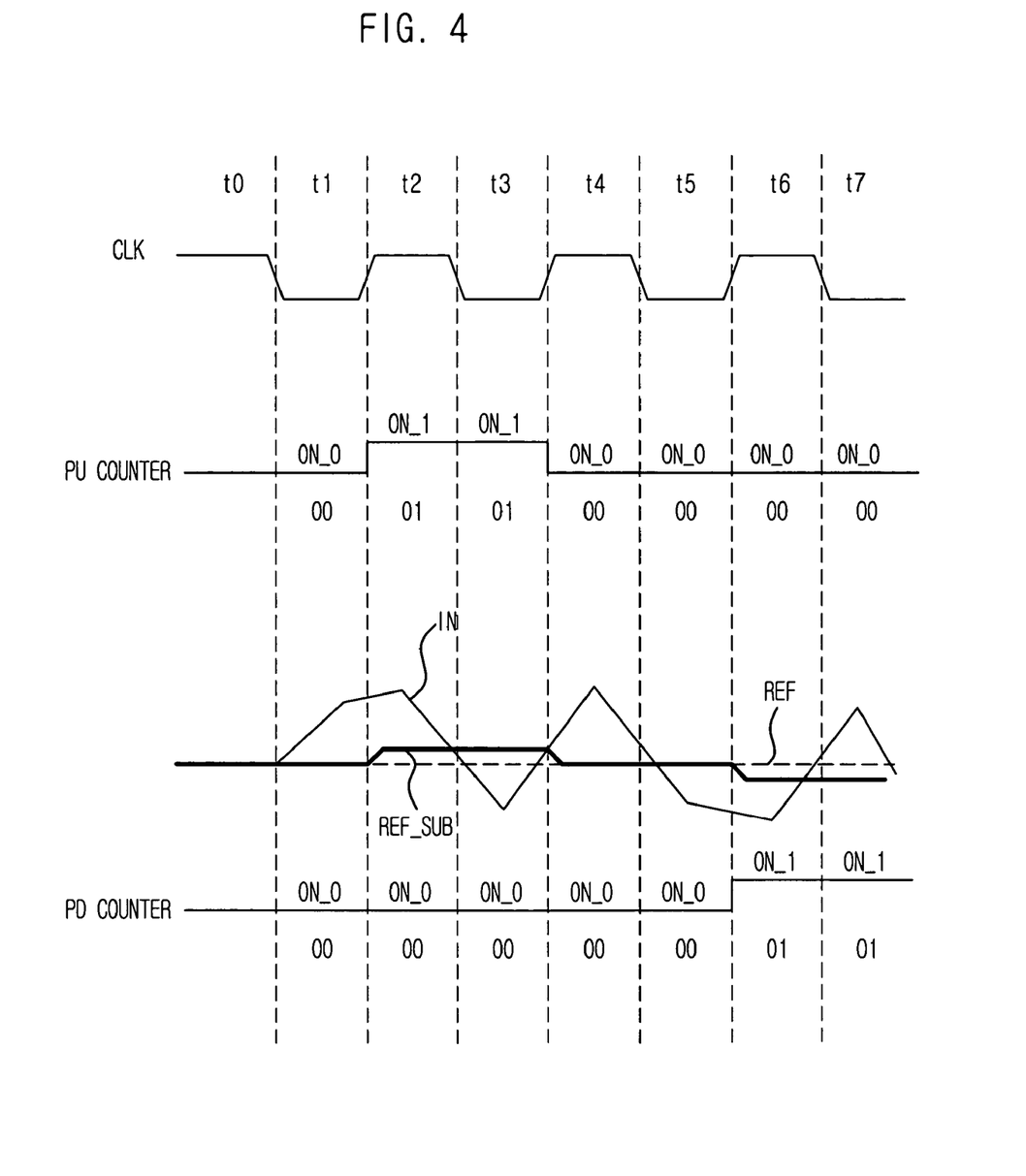
FIGS. 4 to 9 are diagrams illustrating asymmetrical data transmission pattern types of the data input buffer shown in FIG. 3, respectively.

Referring first to FIG. 4, there is provided an asymmetrical data pattern transmission case where at an interval t1 to t2 high data is continuously transmitted, at an interval t3 low data is transmitted, at an interval t4 high data is transmitted, at an interval t5 to t6 low data is continuously transmitted, and at an interval t7 high data is transmitted. That is, it shows a case that data of opposite polarity following two data of same polarity is transmitted.

At the interval t1, the PU counter 142 and the PD counter 122 are all reset at "00" where ISU_0 and ISD_0 are in logic high state and the remainder is all in logic low state. At this time, Q14 and Q18 out of the drive NMOS transistors are turned-on wherein the current i11 flowing on a node N3 and the current i12 flowing on a node N4 are the same as the prior art; and the reference level VREF_SUB of the input sensing unit maintains the same state as the reference voltage VREF.

In the meantime, at the interval t2, the PU counter 142 conducts the counting operation by the continuous high data to provide a count value of "01", and the PD counter 122 maintains the reset state of "00". Thus, ISU_0, ISU_1, and ISD_0 are in logic high state and the remainder is all in logic low state. At this time, Q13, Q14, and Q18 among the drive NMOS transistors are turned-on wherein the current i11 flowing on the node N3 increases relatively, and thus, the reference level VREF_SUB of the input sensing unit becomes higher than the reference voltage VREF by a certain level.

Further, since the interval t3 concerns the low data transmission cycle, the counting operation by the PU counter 142 is no longer conducted and the count value "01" is maintained. The PD counter 122 also maintains the reset state of "00". Thus, the turn-on state of the drive NMOS transistor is maintained as in the interval t2 and the reference level VREF_SUB for input sensing by the input sensing unit is also maintained with the same level as the interval t2.

Next, the interval t4 is the high data transmission cycle, and thus the PU counter 142 is reset at "00" and the PD counter 122 also maintains the reset state of "00". At this time, the turn-on state of the drive NMOS transistor is maintained as in the interval t1 and the input sensing reference level VREF_SUB of the input sensing unit becomes same as the reference level VREF again.

And, since the interval t5 is the low data transmission cycle, the PU counter 142 and the PD counter 122 are all reset at "00". According to this, the reference level VREF_SUB for input sensing by the input sensing unit continues to maintain the same state as the reference voltage VREF.

Meanwhile, since the interval t6 is the low data transmission cycle continuing next to the interval t5, the PD counter 122 conducts the counting operation to provide a count value of "01", and the PU counter 144 also maintains the reset state of "00". Thus, ISD_0, ISD_1, ISU_0 are in logic high state and the remainder is all in logic low state. At this time, Q14, Q17, and Q18 among the drive NMOS transistors are turned-on wherein the current i12 flowing on the node N4 increases relatively, and thus, the reference level VREF_SUB for input sensing by the input sensing unit becomes lower than the reference voltage VREF by a certain level.

Next, since the interval t7 is the high data transmission cycle, the counting operation by the PD counter 122 is no longer conducted and the count value "01" is maintained. The PU counter 142 also maintains the reset state of "00". Thus, the turn-on state of the drive NMOS transistor is maintained as in the interval t6 and the reference level VREF_SUB for input sensing by the input sensing unit is also maintained with the same level as the interval t6.

Considering the foregoing collectively, the PU counter 142 counts continuous high data and the PD counter 122 counts continuous low data. Thus, in the initial state and discontinuous data pattern, the reset state is maintained; and if there are two continuous data with same polarity, two drive NMOS transistors corresponding to their counters are turned-on, if there are three continuous data of same polarity, three drive NMOS transistors corresponding to their counters are turned-on, and if there are four continuous data of same polarity, four drive NMOS transistors corresponding to their counters are turned-on. Further, since the maximum count value is limited, that state is maintained although more than 4 data of same polarity are transmitted repeatedly.

And, if there is occurred data transmission cycle of opposite polarity while increasing the number of the drive NMOS transistor(s) which is (are) turned-on in the manner as discussed above, at that cycle the count value remains unchanged; and at a next cycle it is reset and then the counting operation as mentioned above is performed.

As a result, the number of the drive NMOS transistors being turned-on is decided depending on count values of the PU counter 142 and the PD counter 122. In the below, to understand drive states of the reference level pull-up adjustor 140 and the reference level pull-down adjustor 120 with respect to the state of the PU counter 142 and the PD counter 122 more easily, there is provided Table 1 where the states are defined as ON_0 to ON_3.

TABLE 1

|  | Reference level pull-up adjustor | Reference level pull-down adjustor |
|---|---|---|
| ON_0 | ISU_0 = High. ISU_1/2/3 = Low | ISD_0 = High. ISD_1/2/3 = Low |
| ON_1 | ISU_0/1 = High. ISU_2/3 = Low | ISD_0/1 = High. ISD_2/3 = Low |
| ON_2 | ISU_0/1/2 = High. ISU_3 = Low | ISD_0/1/2 = High. ISD_3 = Low |
| ON_3 | ISU_0/1/2/3 = High | ISD_0/1/2/3 = High |

Figure 5:
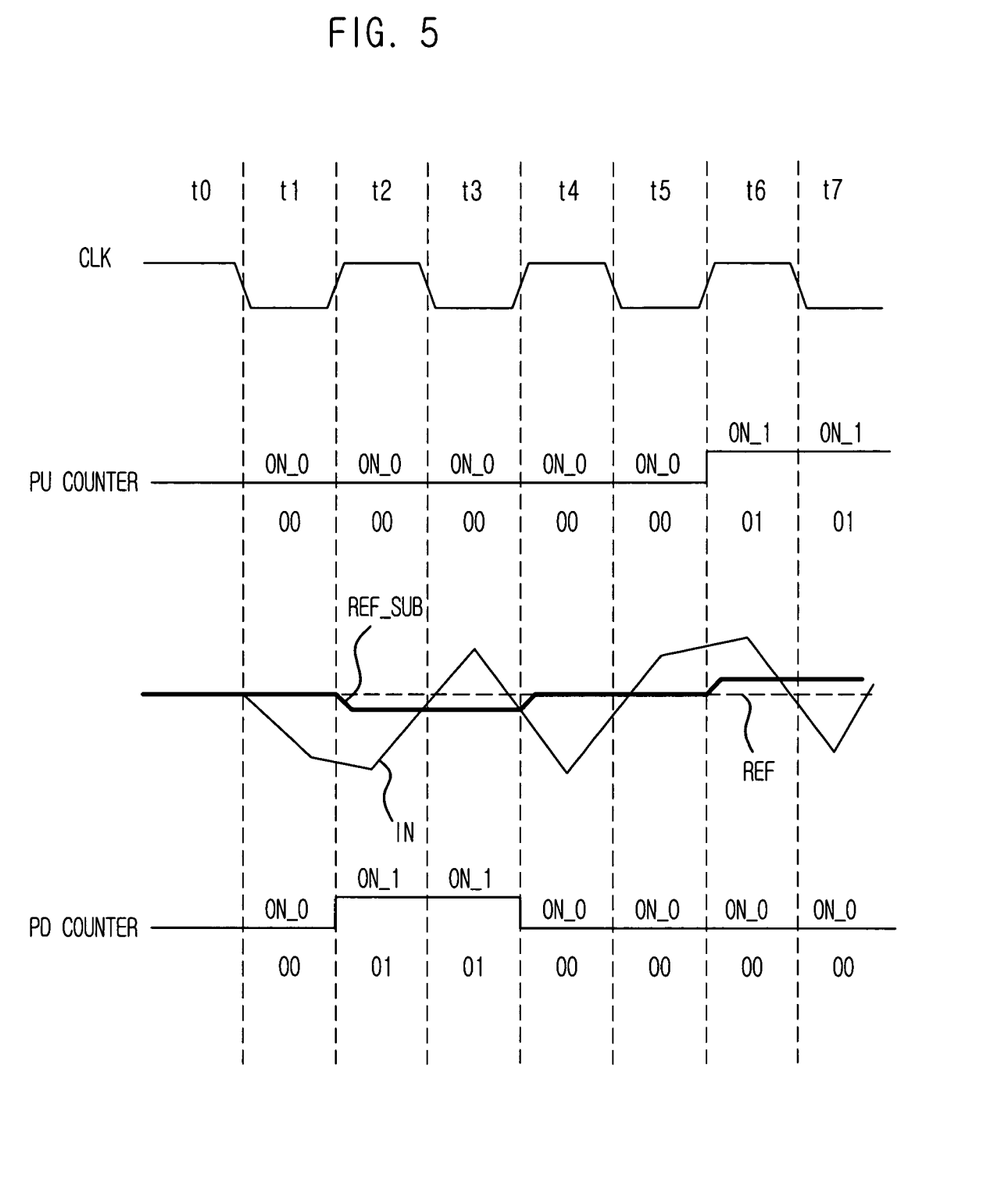

Turning now to FIG. 5, there is presented an asymmetrical data pattern transmission case where at an interval t1 to t2 low data is continuously transmitted, at an interval t3 high data is transmitted, at an interval t4 low data is transmitted, at an interval t5 to t6 high data is continuously transmitted, and at an interval t7 low data is transmitted.

That is, it shows a case that one data with opposite polarity following 2 data with continuously same polarity is transmitted. The PU counter 142 and the PD counter 122 are inversely operated compared to FIG. 4, and thus a change of the reference level VREF_SUB for input sensing by the input sensing unit is made inversely to that in FIG. 4.

Figure 6:
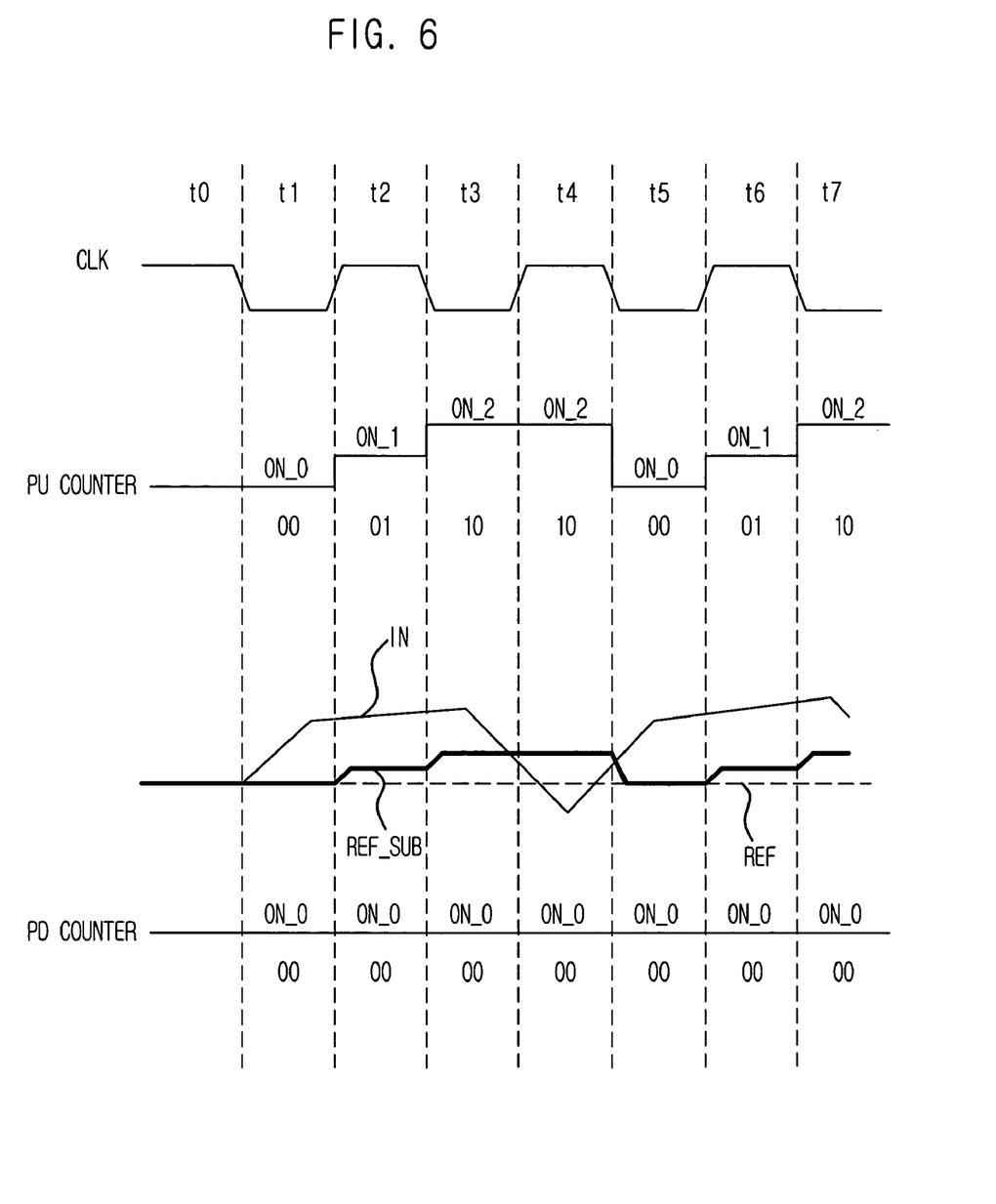

Next, referring to FIG. 6, there is shown an asymmetrical data pattern transmission case where at an interval t1 to t3 high data is continuously transmitted, at an interval t4 low data is transmitted, and at an interval t5 to t7 high data is continuously transmitted again. That is, it shows a case that one data with opposite polarity following 3 data with continuously same polarity is transmitted.

In this case, there is depicted a state that at an interval t2 to t3 the reference level REF_SUB gradually rises for input sensing, at an interval t5 the reference voltage REF level is again restored and at an interval t6 to t7 the reference level REF_SUB rises gradationally.

Figure 7:
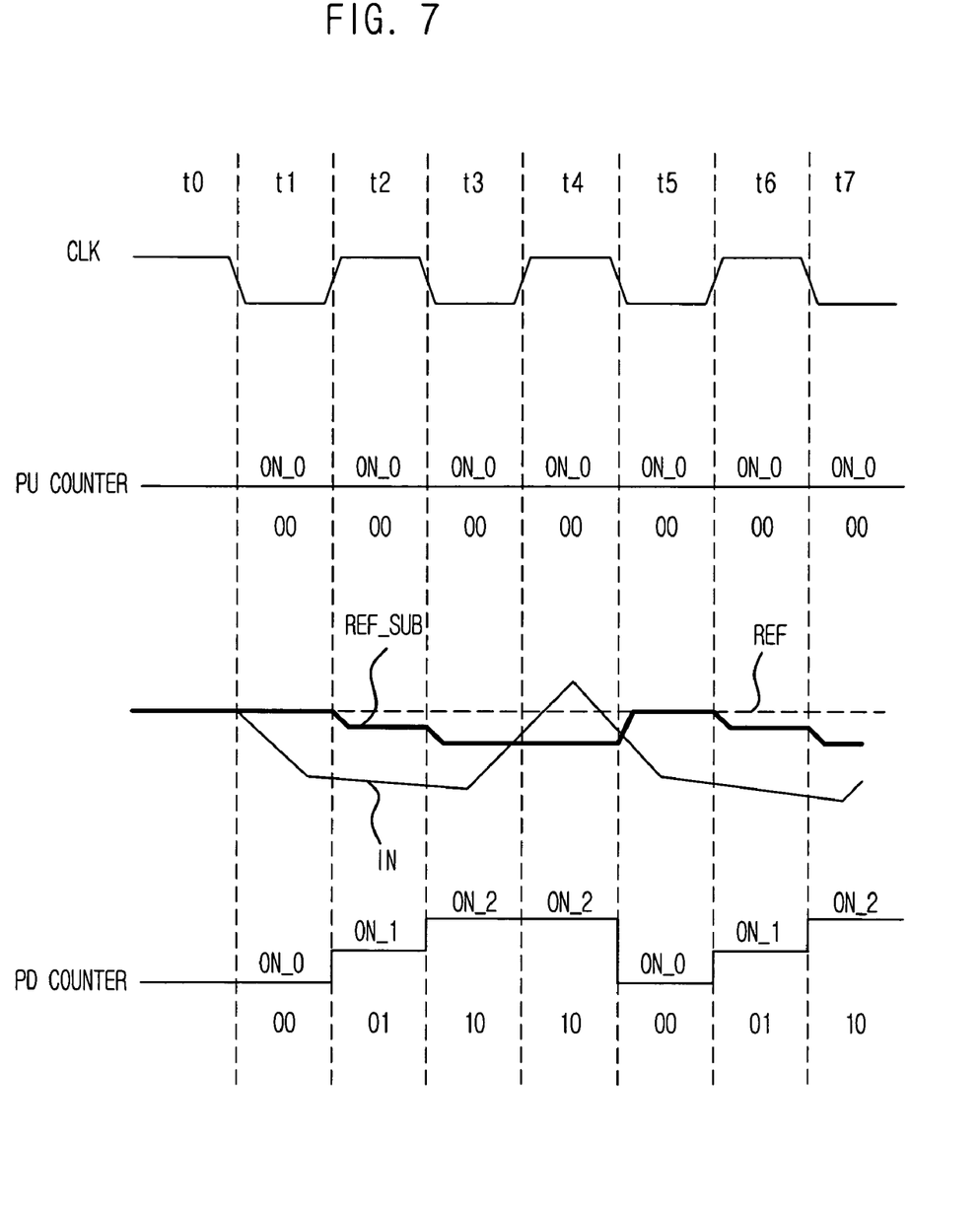

Meanwhile, in FIG. 7, there is shown an asymmetrical data pattern transmission case where at an interval t1 to t3 low data is continuously transmitted, at an interval t4 high data is transmitted, and at an interval t5 to t7 low data is continuously transmitted again. That is, it shows a case that one data with opposite polarity following 3 data with continuously same polarity is transmitted. The PU counter 142 and the PD counter 122 are inversely operated compared to FIG. 6, and thus a change of the reference level VREF_SUB for input sensing by the input sensing unit is made inversely to that in FIG. 6.

Figure 8:
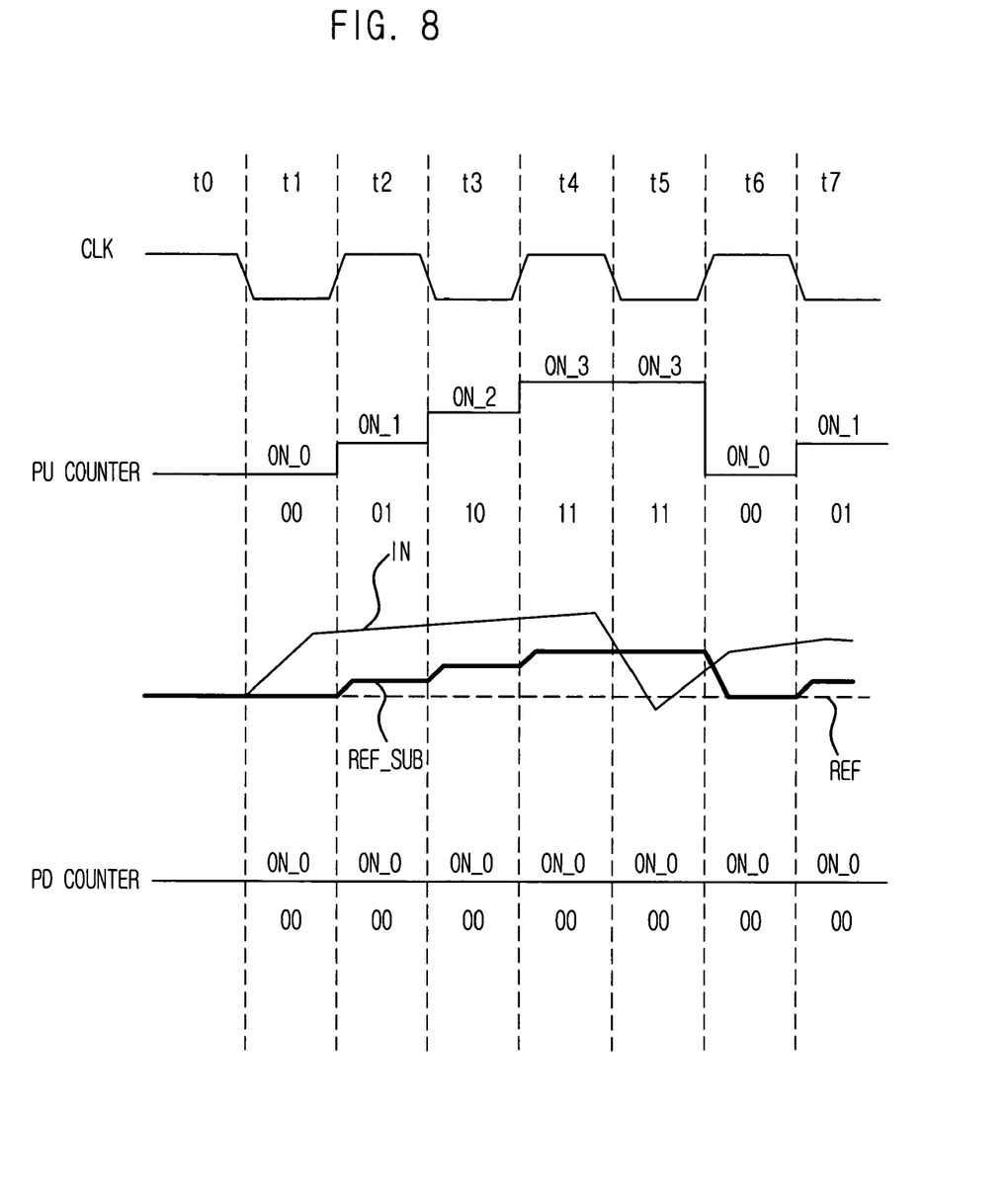

Next, referring to FIG. 8, there is provided an asymmetrical data pattern transmission case where at an interval t1 to t4 high data is continuously transmitted, at an interval t5 low data is transmitted, at an interval t6 to t7 low data is continuously transmitted again, and at an interval t7 low data is transmitted. That is, it shows a case that one data with opposite polarity following 4 data with continuously same polarity is transmitted.

In this case, there is depicted a state that at an interval t2 to t4 the reference level REF_SUB rises gradationally, at an interval t6 the reference voltage REF level is again restored and at an interval t7 the reference level REF_SUB rises.

Figure 9:
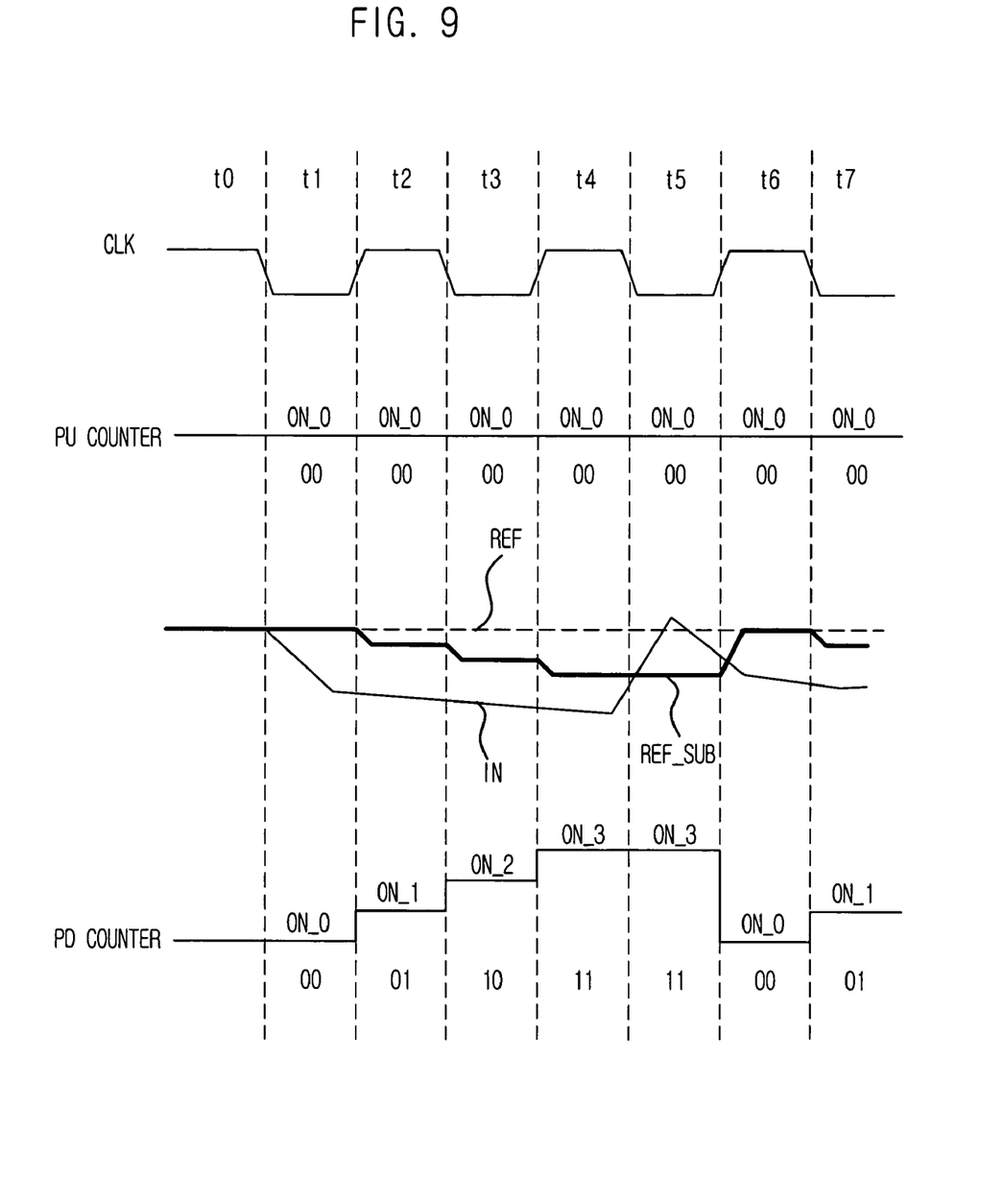

In the meantime, referring to FIG. 9, there is shown an asymmetrical data pattern transmission case where at an interval t1 to t4 low data is continuously transmitted, at an interval t5 high data is transmitted, and at an interval t6 to t7 low data is continuously transmitted again. That is, it shows a case that one data with opposite polarity following 4 data with continuously same polarity is transmitted. The PU counter 142 and the PD counter 122 are inversely operated compared to FIG. 8, and thus a change of the reference level VREF_SUB of the input sensing unit shows is made inversely to that in FIG. 8.

While the present invention has been described with respect to the particular embodiments, it will be apparent to those skilled in the art that various changes and modifications may be made without departing from the spirit and scope of the invention as defined in the following claims.

For example, in the preferred embodiment as described above, there is disclosed one example that implements the input sensing unit using the NMOS type differential amplifier where the current mirror is provided at the power supply voltage port VDD while the bias transistor is presented at the ground port VSS. In contrary to this, however, the present invention may be applied to an instance of implementing the input sensing unit using a PMOS differential amplifier where the current mirror is provided at the ground port VSS while the bias transistor is presented at the power supply voltage port VDD.

Further, although there is presented one example of employing 4 drive NMOS transistors in each of the reference level pull-up/pull-down adjustors, a PMOS transistor may also be used as the drive transistor. Also, the present invention may be applied to a case of changing the number of the drive transistors.

Moreover, in the preferred embodiment of the present invention, although there is provided one example that allows the output signal BIN of the buffering circuit 160 to be used in storing and tracing data transmission pattern, the present invention may also be applied to a case using all signals capable of identifying the polarity of data transmitted.

As a result, the present invention can secure a sufficient data level sensing margin of a data input buffer in a weak data transmission cycle following by adjusting an input sensing reference level in advance toward a strong data direction in a strong data transmission cycle, and also can increase an immunity to noises to the data input buffer using the same.

The present application contains subject matter related to Korean patent application No. 2005-17397, filed in the Korean Patent Office on Mar. 02, 2005, the entire contents of which being incorporated herein by reference.

While the present invention has been described with respect to the particular embodiments, it will be apparent to those skilled in the art that various changes and modifications may be made without departing from the spirit and scope of the invention as defined in the following claims.

What is claimed is:

1. A data input buffer for use in a semiconductor device, comprising:
   an input sensing means for using a reference level for a comparison of a reference voltage and a voltage level of input data to sense a logic level of the input data;
   a reference level adjusting means for adjusting the reference level for an input sensing in the input sensing means in accordance with a transmission pattern of the input data, wherein the reference level adjusting means includes a counter for counting the logic level of each input data which is inputted; and
   a buffering means for buffering an output signal from the input sensing means.

2. The data input buffer as recited in claim 1, wherein the reference level adjusting means further includes:
   a reference level pull-up adjustor for making a pull-up of the reference level for the input sensing in the input sensing means by a preset level compared to the reference voltage by tracing the transmission pattern of the input data; and
   a reference level pull-down adjustor for making a pull-down of the reference level for the input sensing in the input sensing means by a preset level compared to the reference voltage by tracing the transmission pattern of the input data.

3. The data input buffer as recited in claim 2, wherein the reference level pull-up adjustor gradationally makes a pull-up of the reference level for the input sensing in the input sensing means based on a number of times the input data are continuously transmitted in a high level.

4. The data input buffer as recited in claim 3, wherein the reference level pull-down adjustor gradationally makes a pull-down of the reference level of the input sensing in the input sensing means depending on a number of times the input data are continuously transmitted in a low level.

5. The data input buffer as recited in claim 1, wherein the counter counts the input data continuously inputted in an identical level.

6. A data input buffer for use in a semiconductor device, comprising:
   an input sensing means for sensing a logic level of input data based on a comparison of a reference voltage and a voltage level of the input data;
   a reference level pull-up adjusting means for adjusting an amount of current that flows in a reference voltage part of the input sensing means by tracing a transmission pattern of the input data;
   a reference level pull-down adjusting means for adjusting an amount of current that flows in an input data part of the input sensing means by tracing the transmission pattern of the input data; and
   a buffering means for buffering an output signal from the input sensing means, wherein the reference level pull-up adjusting means and the reference level pull-down adjusting means include a counter for counting the input data continuously inputted in an identical level.

7. The data input buffer as recited in claim 6, wherein the reference level pull-up adjusting means includes:
   a first counting means for counting continuous high data outputted from the buffering means;
   a first decoding means for decoding a count value from the first counting means; and
   a first driving means having a plurality of first drivers for driving a current that flows in the reference voltage part of the input sensing means in response to an output signal from the first decoding means.

8. The data input buffer as recited in claim 7, wherein the reference level pull-down adjusting means includes:
   a second counting means for counting continuous low data outputted from the buffering means;
   a second decoding means for decoding a count value from the second counting means; and
   a second driving means having a plurality of second drivers for driving a current that flows in the input data part of the input sensing means in response to an output signal from the second decoding means.

9. The data input buffer as recited in claim 8, wherein the input sensing means includes:
   the reference voltage part for inputting the reference level;
   the input data part for inputting the input data;
   a current mirror which is coupled with the reference voltage input part and the data input part; and
   a bias means for providing a first current path through the reference voltage input part and the first driving means, and a second current path through the data input part and the second driving means, in response to a clock enable signal.

10. The data input buffer as recited in claim 7 or 9, wherein the first driving means is connected in parallel between the reference voltage input part and the bias means and includes a plurality of drive NMOS transistors whose gate inputs each bit of the output signal from the first decoding means.

11. The data input buffer as recited in claim 8 or 9, wherein the second driving means is connected in parallel between the data input part and the bias means and includes a plurality of drive NMOS transistors whose gate inputs each bit of the output signal from the second decoding means.

12. The data input buffer as recited in claim 10, wherein the first counting means is reset in a next cycle of a cycle outputting low data from the buffering means.

13. The data input buffer as recited in claim 11, wherein the second counting means is reset in a next cycle of a cycle outputting high data from the buffering means.

* * * * *

UNITED STATES PATENT AND TRADEMARK OFFICE
CERTIFICATE OF CORRECTION

PATENT NO. : 7,432,743 B2  
APPLICATION NO. : 11/154216  
DATED : October 7, 2008  
INVENTOR(S) : Kang et al.

It is certified that error appears in the above-identified patent and that said Letters Patent is hereby corrected as shown below:

On the title page item (54), and col. 1, line 1, delete "BUTTER" and insert -- BUFFER --.

Col. 8, In Claim 1, line 23, delete "includes" and insert -- include --.

Col. 8, In Claim 1, line 23, delete "logic".

Col. 8, In Claim 1, line 23, delete "level".

Col. 8, In Claim 1, line 23, delete "of".

Col. 8, In Claim 1, line 23, delete "each".

Col. 8, In Claim 1, line 24, delete "which" and insert -- continuously --.

Signed and Sealed this

Nineteenth Day of May, 2009

JOHN DOLL  
*Acting Director of the United States Patent and Trademark Office*